United States Patent [19]

Taylor

[11] Patent Number: 4,617,523
[45] Date of Patent: Oct. 14, 1986

[54] DIFFERENTIAL PAIR WITH COMPENSATION FOR EFFECTS OF PARASITIC CAPACITANCE

[75] Inventor: Stewart S. Taylor, Beaverton, Oreg.

[73] Assignee: Tektronix, Inc., Beaverton, Oreg.

[21] Appl. No.: 763,729

[22] Filed: Aug. 8, 1985

[51] Int. Cl.$^4$ .............................................. H03F 3/45
[52] U.S. Cl. ..................................... 330/261; 330/258
[58] Field of Search ................ 330/252, 254, 258, 261

[56] References Cited

U.S. PATENT DOCUMENTS 3,560,866  2/1971  Haines ................................. 330/254

*Primary Examiner*—James B. Mullins
*Attorney, Agent, or Firm*—John D. Winkelman; John Smith-Hill; William S. Lovell

[57] ABSTRACT

First and second transistors are connected as a differential pair, and a third, current source transistor has its collector connected to the emitters of the first and second transistors and draws a first constant current. Fourth and fifth transistors are connected as a second differential pair with the collectors of the fourth and fifth transistors connected to the collectors of the first and second transistors respectively and with the bases of the fourth and fifth transistors connected to the bases of the second and first transistors respectively. A sixth, current source transistor has its collector connected to the emitters of the fourth and fifth transistors and draws a second constant current that is much smaller than the first constant current. All four transistors of the two differential pairs are essentially identical, and the two current source transistors have the same parasitic capacitances. Consequently, the displacement currents associated with the parasitic capacitance at the collector of the third transistor is replicated at the sixth transistor, and the contributions of the two displacement currents to the collector currents of the differential pairs are common mode, and are substantially cancelled. Feedthrough at the base/collector junctions of the first and second transistors is at least partially cancelled by feedthrough at the base/collector junctions of the fourth and fifth transistors respectively.

7 Claims, 2 Drawing Figures

DIFFERENTIAL PAIR WITH COMPENSATION FOR EFFECTS OF PARASITIC CAPACITANCE

This invention relates to a differential pair with compensation for effects of parasitic capacitance.

BACKGROUND OF THE INVENTION

FIG. 1 of the drawings shows a conventional circuit arrangement comprising a differential pair of transistors Q1 and Q2. A circuit arrangement such as that shown in FIG. 1 may be used in an amplifier or a digital-to-analog converter (DAC). The transistors Q1 and Q2 receive complementary input voltages V and $\overline{V}$ at their bases, the voltages V and $\overline{V}$ swinging about a reference potential level $V_0$. The collectors of the transistors Q1 and Q2 are connected through a load network to a reference potential level $V_{CC}$, and the emitters of the transistors Q1 and Q2 are connected to the collector of a current source transistor Q3, which has its emitter connected to a reference potential level $V_{EE}$. The base of the transistor Q3 is connected to a high gain feedback bias amplifier and draws a constant current or a desired value, dependent on the ratio of the resistance values of the resistors $R_E$ and $R_3$, from the emitters of the transistors Q1 and Q2. The reference potential level $V_0$ lies between the potential levels $V_{CC}$ and $V_{EE}$. The output of the differential pair may be taken from the collectors of the transistors Q1 and Q2 and applied to a differential amplifier A, or alternatively a single-ended output may be taken from the collector of one of the transistors Q1 and Q2. Parasitic capacitances are associated with the collector of the transistor Q3. Therefore, when the differential input voltage changes, and brings about a change in the voltage $V_1$ at the emitters of the transistors Q1 and Q2, a displacement current proportional to $dV_1/dt$ is drawn from the emitters of the transistors Q1 and Q2. The displacement current is distributed between Q1 and Q2 in dependence upon the values of V and $\overline{V}$. This capacitive displacement current causes perturbations in the output signal and increases settling time. This is particularly disadvantageous in the case of a DAC, because it increases the duration of the conversion cycle.

Moreover, when the voltage at the base of the transistor Q1 changes, charge is injected into the load network through the parasitic base/collector capacitance $C_{jc1}$, and this causes a transient at the collector of the transistor. The voltage transients at the collectors of the transistors Q1 and Q2 are in opposite senses, and therefore they are added when the collector voltages are combined by the differential amplifier A.

SUMMARY OF THE INVENTION

In a preferred embodiment of the invention, first and second bipolar transistors are connected as a differential pair, and a third, current source transistor has its collector connected to the emitters of the first and second transistors and draws a first constant current. Fourth and fifth bipolar transistors are connected as a second differential pair with the collectors of the fourth and fifth transistors connected to the collectors of the first and second transistors respectively and with the bases of the fourth and fifth transistors connected to the bases of the second and first transistors respectively. A sixth, current source transistor has its collector connected to the emitters of the fourth and fifth transistors and draws a second constant current that is much smaller than the first constant current. All four transistors of the two differential pairs are essentially identical, and the two current source transistors have the same parasitic capacitances. Consequently, the displacement currents associated with the parasitic capacitance at the collector of the third transistor is replicated at the sixth transistor. The contributions of the two displacement currents to the collector currents of the differential pairs are common mode, and are substantially cancelled. Feedthrough at the base/collector junctions of the first and second transistors is at least partially cancelled by feedthrough at the base/collector junctions of the fourth and fifth transistors respectively.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
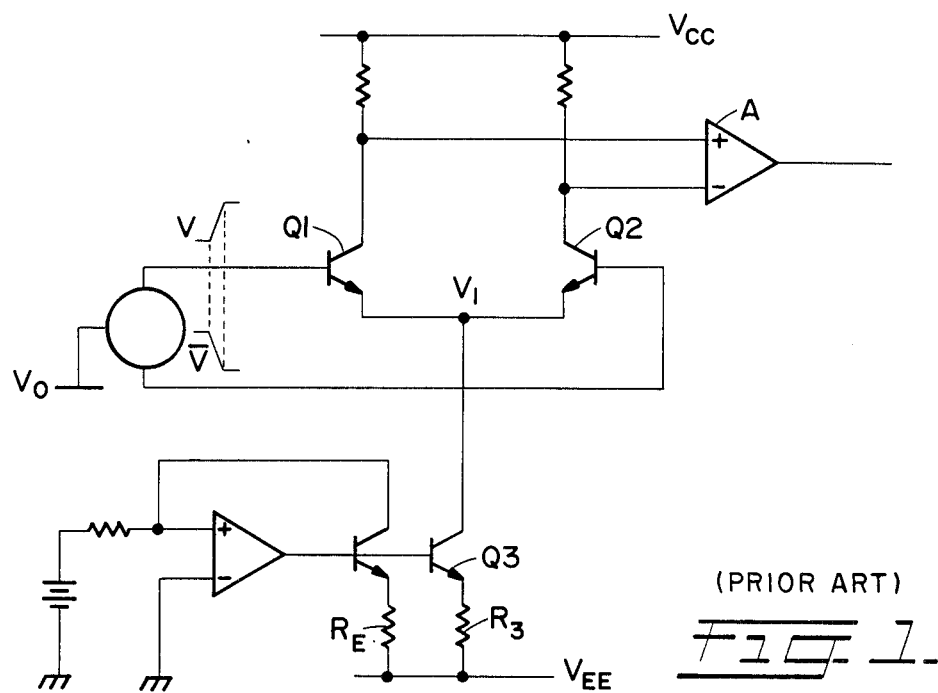
FIG. 1 is a schematic diagram of a conventional differential amplifier.
Figure 2:
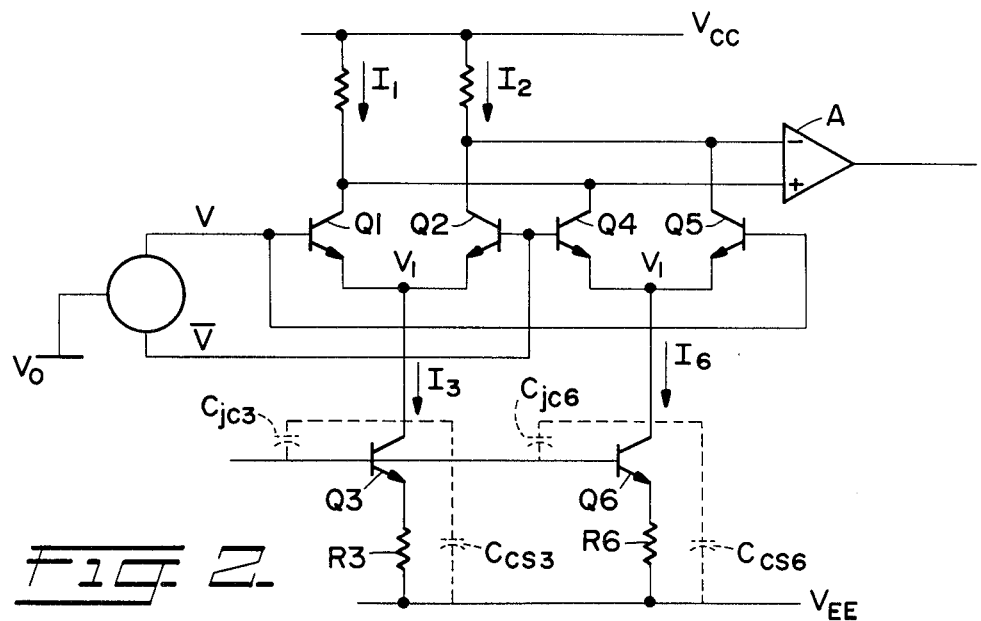
FIG. 2 is a schematic diagram of a differential amplifier embodying the present invention.

The differential amplifier shown in FIG. 2 is identical to that shown in FIG. 1 except that it includes a second differential pair Q4, Q5 and a second current source transistor Q6. The transistors Q3 and Q6 have the same collector/substrate and base/collector junction areas. Consequently, the collector/substrate capacitances $C_{cs}$ of the transistors Q3 and Q6 are the same, and the collector/base capacitances $C_{jc}$ of the transistors Q3 and Q6 are also the same. However, the emitter resistance $R_6$ associated with the transistor Q6 is much larger than the emitter resistance $R_3$ associated with the transistor Q3, and consequently the current $I_6$ drawn by the transistor Q6 is much less than the current $I_3$ drawn by the transistor Q3. In fact, the current $I_6$ may approach zero.

The transistors Q4 and Q5 are identical to the transistors Q1 and Q2 (which are themselves identical). The collectors of the transistors Q4 and Q5 are connected to the collectors of the transistors Q1 and Q2, while the bases of the transistors Q4 and Q5 are connected to the bases of the transistors Q2 and Q1 respectively.

Because the transistors Q4 and Q5 are identical to the transistors Q1 and Q2, the voltage $V_1$ at the emitters of the transistors Q4 and Q5 is nearly equal to the voltage at the emitters of the transistors Q1 and Q2. Consequently, the displacement current that flows in the emitter of the transistor Q5 is nearly equal to that which flows in the emitter of the transistor Q1, and the displacement current that flows in the emitter of the transistor Q4 is the same as that which flows in the emitter of the transistor Q2. Consequently, when a differential output is taken from the collectors of the transistors Q1 and Q2, the displacement currents are substantially cancelled.

A single-ended output may be taken, e.g. from the collector of the transistor Q1, and the transients caused by charge injected through the parasitic base/collector capacitances of the transistors Q1 and Q4 tend to cancel, since they are in opposite senses. It is, however, preferred that a full differential output be taken, as shown in FIG. 2, so as to achieve not merely cancellation of the transients due to the parasitic capacitances of the base/collector junctions of the transistors Q1 and Q2 but also cancellation of the displacement currents.

It will be understood that since the operation of the described circuit relies on matching of the transistors, the invention is particularly attractive for monolithic integration.

It will be appreciated that the present invention is not restricted to the particular embodiment that has been described and illustrated, and that variations may be made therein without departing from the scope of the invention as defined in the appended claims, and equivalents thereof. For example, the invention has been described with reference to bipolar transistors, it is equally applicable to field effect transistors, and may be implemented with, e.g., MOSFETs, JFETs or MESFETs or both bipolar transistors and FETs.

I claim:

1. An electronic circuit comprising six transistors each having a control electrode and first and second controlled current electrodes, a first and a second transistor being connected as a first differential pair with their control electrodes connected to input terminals of the circuit, the first controlled current electrode of each of the first and second transistors connected to a first reference potential level and the second controlled current electrodes to the two transistors connected together, a third transistor being connected as a current source drawing a first constant current and having its first controlled current electrode connected to the second controlled current electrodes of the first and second transistors and its second controlled current electrode connected to a second reference potential level, a fourth and a fifth transistor being connected as a second differential pair with their first controlled current electrodes connected to the first controlled current electrodes of the first and second transistors respectively, the control electrodes of the fourth and fifth transistors connected to the control electrodes of the second and first transistors respectively and the second controlled current electrodes of the fourth and fifth transistors connected together, and the sixth transistor being connected as a current source drawing a second constant current, substantially smaller than the first constant current, and having its first controlled current electrode connected to the second controlled current electrodes of the fourth and fifth transistors and its second controlled current electrode connected to the second reference potential level.

2. A circuit according to claim 1, wherein each of the six transistors is a bipolar transistor, the control electrode being the base of the transistor, the first controlled current electrode being the collector of the transistor and the second controlled current electrode being the emitter of the transistor.

3. A circuit according to claim 1, wherein the parasitic capacitance associated with the junctions between the control electrode and the first controlled current electrode of each of the first, second, fourth and fifth transistors is substantially the same.

4. A circuit according to claim 3, having an output terminal connected to the first controlled current electrode of the first transistor.

5. A circuit according to claim 1, further comprising a differential output circuit having two input terminals connected to the first controlled current electrodes of the first and second transistors respectively.

6. A circuit according to claim 5, wherein the parasitic capacitance associated with the first controlled current electrode for each of the third and sixth transistors is substantially the same.

7. A circuit according to claim 1, wherein the control current electrodes of the third and sixth transistors are connected together and the second controlled current electrodes of the third and sixth transistors are connected to the second reference potential level through first and second resistors respectively, the resistance value of the second resistor being much greater than that of the first resistor.

* * * * *